US012785570B2

(12) United States Patent
Kannan et al.

(10) Patent No.: US 12,785,570 B2
(45) Date of Patent: Nov. 3, 2026

(54) COMMUNICATION OF FEEDBACK AND FAULT INFORMATION IN AN ISOLATED POWER CONVERTER

(71) Applicant: TEXAS INSTRUMENTS INCORPORATED, Dallas, TX (US)

(72) Inventors: Bharath Kannan, Merrimack, NH (US); Usama Anwar, Brooklyn, NY (US); Michael Corry, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 98 days.

(21) Appl. No.: 18/587,068

(22) Filed: Feb. 26, 2024

(65) Prior Publication Data

US 2025/0274047 A1 Aug. 28, 2025

(51) Int. Cl.

*H02M 3/335* (2006.01)
*H02M 3/16* (2006.01)
*H03K 3/037* (2006.01)

(52) U.S. Cl.

CPC .............. *H02M 3/16* (2013.01); *H03K 3/037* (2013.01); *H02M 3/33515* (2013.01); *H02M 3/33523* (2013.01); *H02M 3/33576* (2013.01)

(58) Field of Classification Search

CPC ......... H02M 3/33515; H02M 3/33576; H02M 3/33523

See application file for complete search history.

(56) References Cited

U.S. PATENT DOCUMENTS 5,900,683 A * 5/1999 Rinehart .............. H03K 17/567 307/129
9,673,809 B1 * 6/2017 Kandah ................ H03K 17/691
2008/0192509 A1 * 8/2008 Dhuyvetter ....... H02M 3/33523 363/16
2013/0264961 A1 * 10/2013 Chang .................. H04B 10/802 315/201
2017/0012622 A1 * 1/2017 Peter ................... H04L 25/0266
2017/0271977 A1 * 9/2017 Madiwale ......... H02M 3/33523
2020/0083813 A1 * 3/2020 Tang ................. H02M 3/33523
2020/0350905 A1 * 11/2020 Bang ................ H03K 17/08122
2021/0376735 A1 * 12/2021 Parisi ................ H02M 3/33592
2022/0200438 A1 * 6/2022 Ahmed ................... H02M 7/21

* cited by examiner

*Primary Examiner* — Gary A Nash
(74) *Attorney, Agent, or Firm* — Charles F. Koch

(57) ABSTRACT

A power converter includes an isolator having a first terminal, a second terminal, a third terminal, and a fourth terminal. A first circuit has a first terminal coupled to the first terminal of the isolator and has a second terminal coupled to the second terminal of the isolator. A second circuit has a first terminal coupled to the third terminal of the isolator and has a second terminal coupled to the fourth terminal of the isolator. The second circuit includes a controller configured to transmit a control signal through the isolator to the first circuit. The control signal includes a first indication to turn on power transmission through the isolator from the first circuit to the second circuit, a second indication of a status, and a third indication to turn off power transmission.

24 Claims, 13 Drawing Sheets

COMMUNICATION OF FEEDBACK AND FAULT INFORMATION IN AN ISOLATED POWER CONVERTER

BACKGROUND

An isolated power converter includes an isolation barrier, e.g., a transformer, between a first circuit (also referred to as the "primary side circuit") and a second circuit (also referred to as the "secondary side circuit"). The first circuit may include transistors coupled to one side of the isolation barrier, e.g., to a primary winding of a transformer. The second circuit includes a rectifier coupled to the other side of the isolation barrier, e.g., to the secondary winding of the transformer. A controller turns the transistors of the first circuit on and off to convert an input voltage, VIN, to a time-varying voltage to cause energy to be transferred through the isolation barrier. The rectifier circuit converts the time-varying voltage from the isolation barrier to a direct current (DC) voltage, VOUT, and current for powering a load.

Some isolated power converters have a communication channel through the isolation barrier by which the second circuit can communicate ON and OFF indications. When the output voltage VOUT from the power converter falls below a lower threshold, the second circuit communicates an ON indication through the communication channel to cause the first circuit to turn on power transfer through the isolation barrier. When the output voltage VOUT from the power converter reaches an upper threshold, the second circuit communicates an OFF indication through the communication channel to cause the first circuit to turn off power transfer through the isolation barrier. The ON and OFF indications help the power converter to regulate the level of the output voltage.

SUMMARY

In one example, a power converter includes an isolator having a first terminal, a second terminal, a third terminal, and a fourth terminal. A first circuit has a first terminal coupled to the first terminal of the isolator and has a second terminal coupled to the second terminal of the isolator. A second circuit has a first terminal coupled to the third terminal of the isolator and has a second terminal coupled to the fourth terminal of the isolator. The second circuit includes a controller configured to transmit a control signal through the isolator to the first circuit. The control signal includes a first indication to turn on power transmission through the isolator from the first circuit to the second circuit, a second indication of a status, and a third indication to turn off power transmission.

In another example, a power converter includes an isolator having a first terminal, a second terminal, a third terminal, and a fourth terminal. A first circuit has a first terminal coupled to the first terminal of the isolator and has a second terminal coupled to the second terminal of the isolator. A second circuit has a first terminal coupled to the third terminal of the isolator and has a second terminal coupled to the fourth terminal of the isolator. The first circuit includes a decoder configured to decode a control signal received from the second circuit through the isolator. The control signal includes a first indication to turn on power transmission through the isolator to the second circuit, a second indication of a status of the second circuit, and a third indication to turn off power transmission.

In yet another example, a power converter includes an isolator having a first terminal, a second terminal, a third terminal, and a fourth terminal. A first circuit has a first terminal coupled to the first terminal of the isolator and has a second terminal coupled to the second terminal of the isolator. A second circuit has a first terminal coupled to the third terminal of the isolator and has a second terminal coupled to the fourth terminal of the isolator. The second circuit includes a controller configured to transmit a control signal through the isolator to the first circuit. The control signal includes a first indication to turn on power transmission through the isolator from the first circuit to the second circuit, a second indication of whether the second circuit is receiving power from the isolator, and a third indication to turn off power transmission. The second indication indicated in a length of a signal pulse. The first circuit receives the control signal from the second circuit through the isolator and determines the second indication.

DETAILED DESCRIPTION

Figure 1:
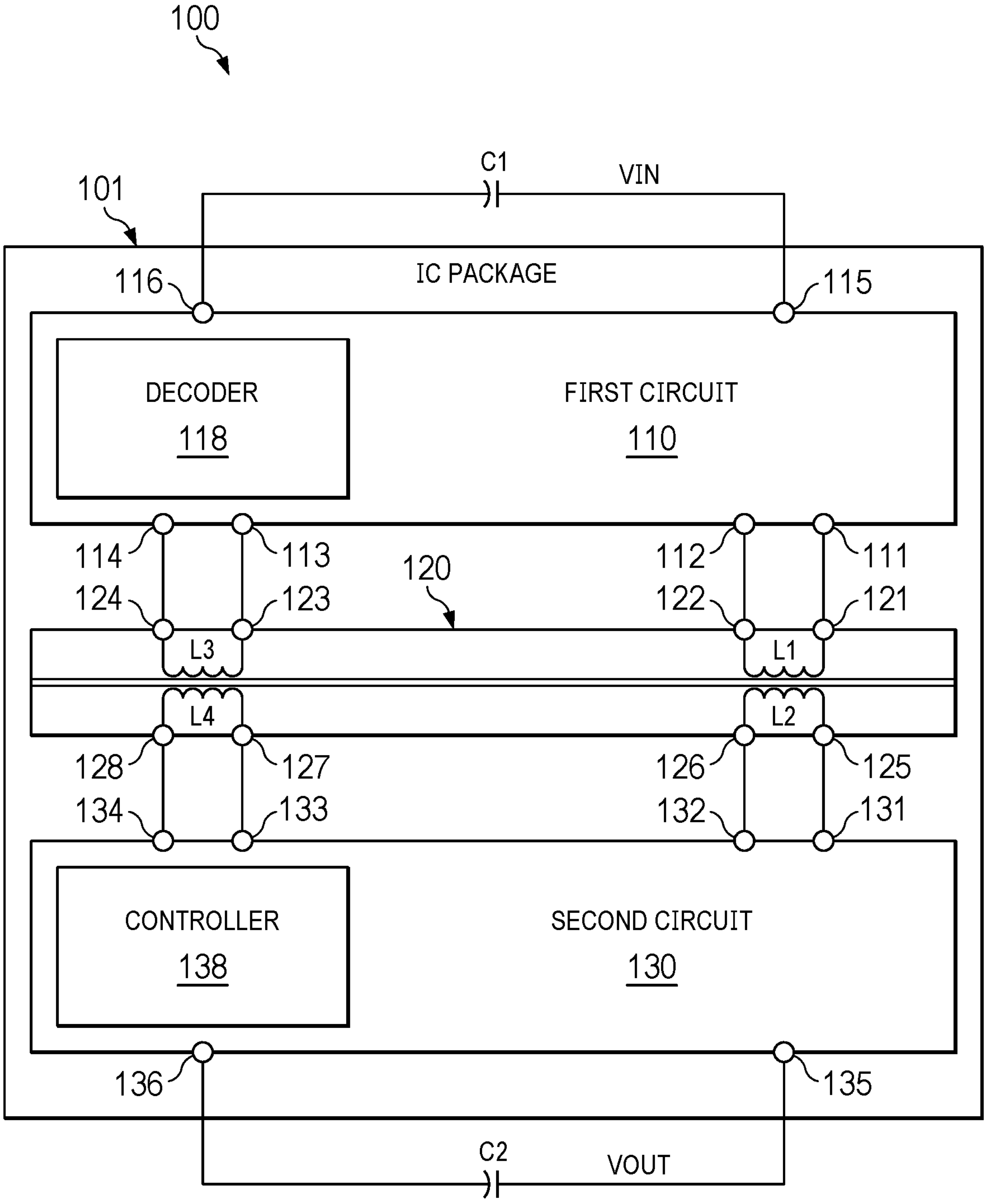
FIG. 1 is a block diagram of an isolated power converter, in an example.

The same reference numbers or other reference designators are used in the drawings to designate the same or similar (either by function and/or structure) features.

FIG. 1 is a block diagram of an isolated power converter 100, which includes a first circuit 110, an isolator 120, a second circuit 130, and capacitors C1 and C2. Isolated power converter 100 converts an input voltage VIN into an output voltage VOUT. In the example of FIG. 1, first and second circuits 110 and 130 and isolator 120 are provided in the same integrated circuit (IC) package 101. First circuit 110 may be fabricated on one semiconductor die. Second circuit 130 may be fabricated on another semiconductor die. Isolator 120 may be fabricated within the lead frame to which either or both of the dies containing first and second circuits 110 and 130 are attached. The dies and isolator 120 may be packaged together in the same IC package 101. Capacitors C1 and C2 may be external but coupled to the IC package 101. In another example, capacitors C1 and C2 may be included as well on IC package 101.

First circuit 110 has terminals 111, 112, 113, 114, 115, and 116. Capacitor C1 is coupled across terminals 115 and 116. First circuit 110 includes a decoder 118. Isolator 120 includes coils L1, L2, L3, and L4. Second circuit 130 has terminals 131, 132, 133, 134, 135, and 136. Second circuit 130 includes a controller 138.

In the example of FIG. 1, isolator 120 includes coils L1, L2, L3, and L4. Coils L1 and L2 may form a first transformer, and coils L3 and L4 may form a second transformer. The first and second transformers may share a core or may have separate cores. In other examples, isolator 120 may be other than coils forming a transformer. Isolator has terminals 121, 122, 123, 124, 125, 126, 127, and 128.

Coil L1 is coupled to terminals 121 and 122, and terminals 121 and 122 are coupled to terminals 111 and 112, respectively, of first circuit 110. Coil L2 is coupled to terminals 125 and 126, and terminals 125 and 126 are coupled to terminals 131 and 132, respectively, of second circuit 130. Coil L3 is coupled to terminals 123 and 124, and terminals 123 and 124 are coupled to terminals 113 and 114, respectively, of first circuit 110. Coil LA is coupled to terminals 127 and 128, and terminals 127 and 128 are coupled to terminals 133 and 134, respectively, of second circuit 130.

Power is transferred from first circuit 110 through coils L1 and L2 to second circuit 130. Data is transferred from second circuit 130 through coils L3 and L4 to first circuit 110. A data channel including coils L4 and L3 of isolator 120 may be used by second circuit 130 to communicate with first circuit 110, for example by transmitting TURN-ON and TURN-OFF indications as well as status and fault indications, as described below. Second circuit 130 generates the TURN-ON indication in response to the output voltage VOUT falling below a lower threshold. The TURN-ON indication is received from isolator 120 and decoded by decoder 118 of first circuit 110. First circuit 110 responds to the TURN-ON indication by turning on power transfer through coils L1 and L2 to second circuit 130. First circuit 110 may include switching devices, e.g., transistors, to convert input voltage VIN to a switching waveform to be applied across coil L1. Second circuit 130 may include a rectifier to convert the received switching waveform from coil L2 to a direct current (DC) voltage to charge capacitor C2 thereby increasing the output voltage VOUT.

In response to the output voltage VOUT reaching an upper threshold, second circuit 130 generates the TURN-OFF indication, which is transmitted through coils L3 and L4 to first circuit 110. First circuit 110 receives and decodes, e.g., by decoder 118, the OFF indication and, in response, turns off power transfer through coils L1 and L2. As a result of the cessation of power transfer, the output voltage VOUT decreases, and the process repeats. Accordingly, second circuit 130 generates the TURN-ON and TURN-OFF indications as feedback signals to first circuit 110 to thereby regulate the level of the output voltage VOUT.

Figure 2:
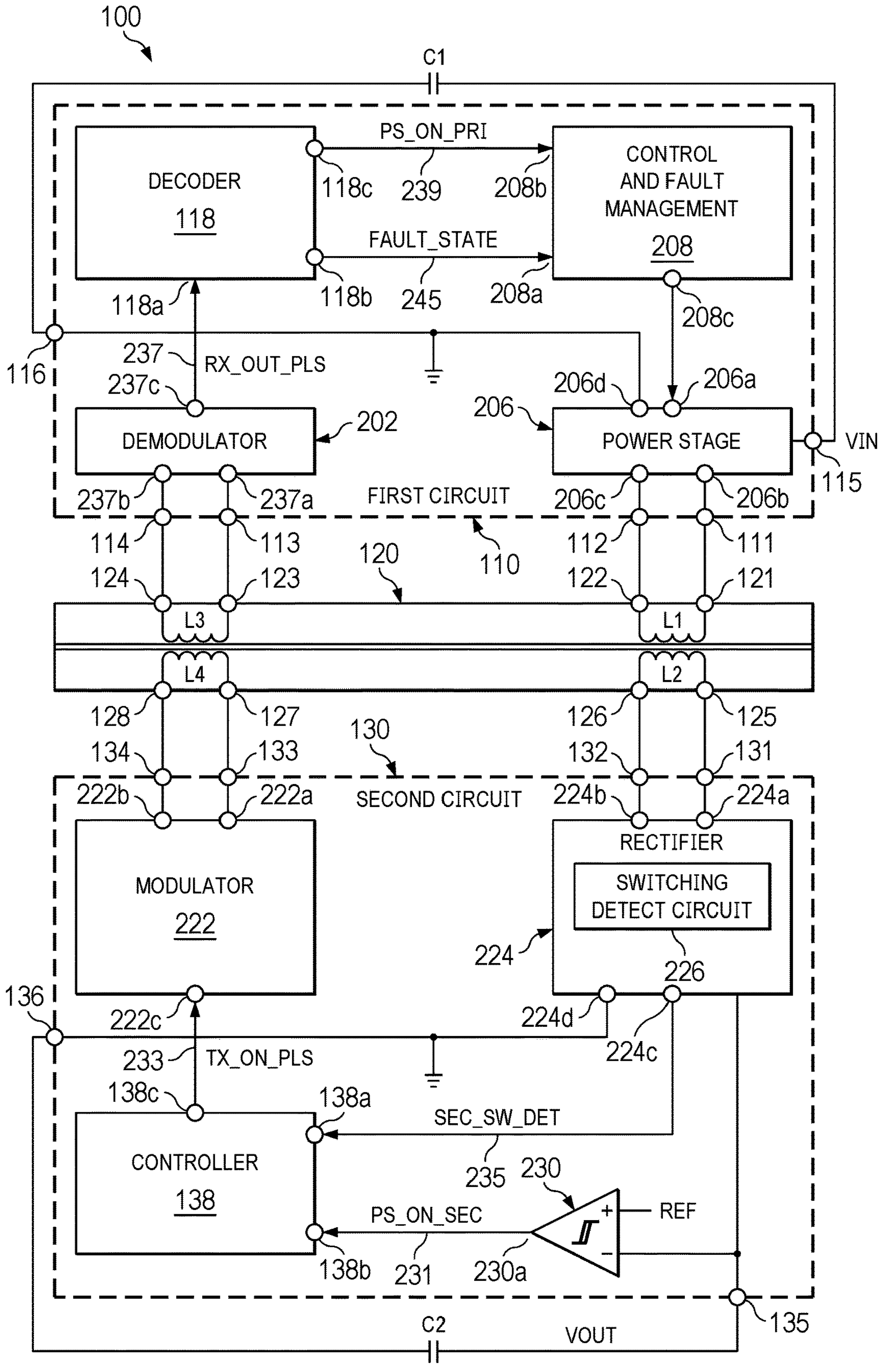
FIG. 2 is a block diagram of the isolated power converter, in another example.

FIG. 2 is a block diagram of isolated power converter 100 including additional components within first circuit 110 and second circuit 130, in an example. First circuit 110 includes decoder 118, a demodulator 202, control and fault management 208, and a power stage 206. Demodulator 202 includes terminals 237*a* and 237*b* which are coupled through terminals 113 and 114 of first circuit 110 to terminals 133 and 134 of coil L3. An output terminal 237*c* of demodulator 202 is coupled to an input 118*a* of decoder 118 and provides an RX_OUT_PLS signal 237 to decoder 118. Decoder 118 has output terminals 118*b* and 118*c* which are coupled to inputs 208*a* and 208*b*, respectively, of control and fault management 208. Decoder 118 provides a PS_ON_PRI signal 239 and a FAULT_STATE 245 to control and fault management 208. Control and fault management 208 has an output terminal 208*c* which is coupled to an input terminal 206*a* of power stage 206. Power stage 206 has terminals 206*b* and 206*c*, which are coupled through first circuit terminals 111 and 112 to terminals 121 and 122 of coil L1. Capacitor C1 has a first terminal coupled through terminal 115 to power stage 206. Capacitor C1 has a second terminal coupled through terminal 116 to a ground terminal 206*d* of power stage 206.

Second circuit 130 includes controller 138, a modulator 222, a rectifier 224, and a comparator 230. Modulator 222 has terminals 222*a* and 222*b* coupled through terminals 133 and 134 of second circuit 130 to terminals 127 and 128 of coil L4. Rectifier 224 has terminals 224*a* and 224*b* coupled through terminals 131 and 132 of second circuit 130 to terminals 125 and 126 of coil L2. Rectifier 224 has an output terminal 224*c* coupled to an input terminal 138*a* of controller 138. Rectifier 224 has a switching detect circuit 226, which is coupled to output terminal 224*c*. An example of a switching detect circuit 226 is provided in FIG. 12, described below. Switching detect circuit 226 generates a signal SEC_SW_DET 235 to controller 138. Comparator 230 has a positive (+) input terminal, a negative (−) input terminal, and output terminal 230*a*. In this example, the positive input terminal receives a reference voltage (REF), and the negative terminal is coupled to a terminal of capacitor C2 and accordingly receives the output voltage VOUT. The other terminal of capacitor C2 is coupled to terminal 136 of second circuit 130. Terminal 136 of second circuit 130 is coupled to a ground terminal 224*d* of rectifier 224. The output terminal 230*a* is coupled to an input 138*b* of controller 138. Comparator 230 generates a signal PS_ON_SEC 231 to controller 138. Controller 138 has an output terminal 138*c*, which is coupled to an input terminal 222*c* of modulator 222. Controller 138 generates signal TX_ON_PLS 233 to modulator 222.

Figure 3:
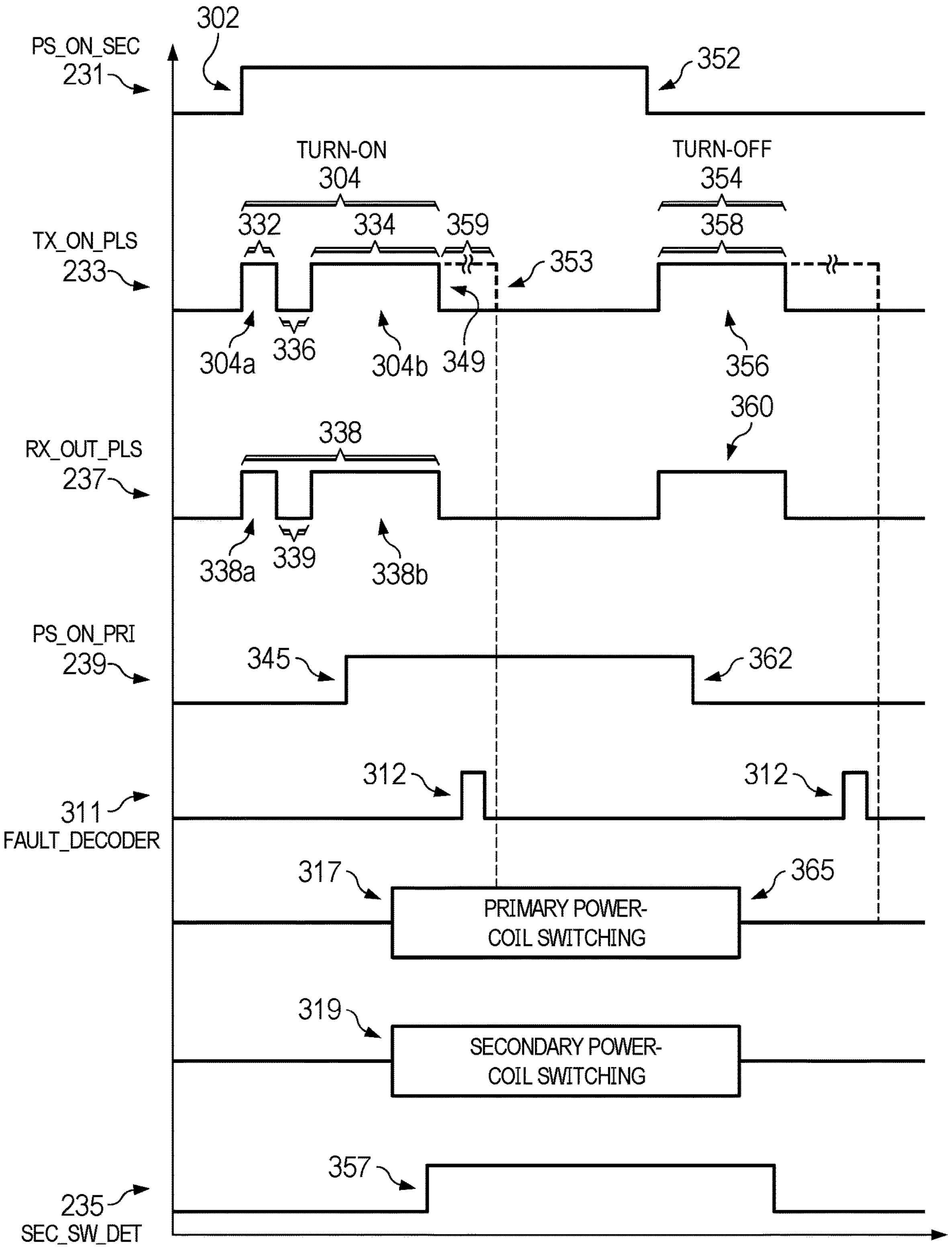
FIG. 3 is a timing diagram illustrating the operation of the isolated power converter of FIG. 2, in an example.

The operation of isolated power converter 100 is described with respect to the timing diagram of FIG. 3. When power transfer through coils L1 and L2 is off, capacitor C2 begins to discharge into the load (not shown) powered by isolated power converter 100. Accordingly, output voltage VOUT decreases. Comparator 230 compares the magnitude of output voltage VOUT to the reference voltage REF. Comparator 230 may implement a hysteresis voltage difference (HYST) centered on the reference voltage REF (e.g., REF+HYST/2 and REF−HYST/2). When the voltage VOUT falls below REF−(HYST/2), comparator 230 forces signal PS_ON_SEC 231 to a logic high state, as indicated by rising edge 302 in FIG. 3. Controller 138 responds to a logic high assertion of signal PS_ON_SEC 231 by generating the TX_ON_PLS signal 233 to provide a TURN-ON indication 304 to modulator 222.

In one example, the TURN-ON indication 304 includes signaling of the TX_ON_PLS signal 233 that is characterized by the TX_ON_PLS signal 233 including a pair of pulses 304*a* and 304*b* with pulse 304*b* being longer than pulse 304*a*. In a specific example, the TURN-ON indication 304 is characterized by: (a) the TX_ON_PLS signal 233 including a pair of pulses 304*a* and 304*b*, (b) pulse 304*a* having a pulse width 332 of 25 ns, (c) pulse 304*b* having a pulse width 334 of at least 50 ns, and (d) the time period 336 between pulses 304*a* and 304*b* being 30 ns. In other examples, the aforementioned time periods can have different values.

In response to receipt of the TURN-ON indication 304, modulator 222 modulates a carrier signal using the TX_ON_PLS signal 233, which includes the TURN-ON indication. The TX_ON_PLS signal-modulated carrier signal is transferred through coils L4 and L3 of isolator 120 to demodulator 202. Demodulator 202 demodulates the carrier signal to recover the TX_ON_PLS signal 233 as RX_OUT_PLS signal 237. The RX_OUT_PLS signal 237 includes the TURN-ON indication, indicated in FIG. 3 as TURN-ON indication 338. TURN-ON indication 338 includes pulses 338*a* and 338*b* separated by a time period 339. The widths of pulses 338*a* and 338*b* and the time period 339 generally match the widths of corresponding pulses 304*a* and 304*b* and time period 336. Decoder 118 receives the RX_OUT_PLS signal 237, which includes the TURN-ON indication 338 and, in response, asserts (e.g., logic high at rising edge 345) the PS_ON_PRI signal 239 to control and fault management 208. Control and fault management 208 responds to the logic high assertion of the PS_ON_PRI signal 239 by causing power stage 206 to turn on and begin transferring power from coil L1 to coil L2 of isolator 120 as indicated at 317. Turning on power stage 206, for example, causes a time-varying current to occur between terminals 121 and 122 of coil L1. Rectifier 324 rectifies the received power from a time-varying current to a DC current to charge capacitor C2 thereby causing the output voltage VOUT to increase.

When the output voltage VOUT exceeds REF−(HYST/2), comparator 230 forces the PS_ON_SEC signal 231 to a logic low state at falling edge 352. Controller 138 responds to a logic low assertion of the PS_ON_SEC signal 231 by generating the TX_ON_PLS signal 233 to provide a TURN-OFF indication 354 to modulator 222. In one example, the TURN-OFF indication 354 includes a single pulse 356 of a prescribed pulse width 358 of, for example, at least 50 ns.

Modulator 222 communicates the TX_ON_PLS signal 233 with the TURN-OFF indication 354 through the isolator 120 as explained above. Demodulator 202 recovers the TX_ON_PLS signal 233 as the RX_OUT_PLS signal 237 having the TURN-OFF indication (TURN-OFF indication 360). Decoder 118 responds to the TURN-OFF indication by forcing the PS_ON_PRI signal 239 to a logic low state at falling edge 362. Control and fault management 208 responds to the logic low state of the PS_ON_PRI signal 239 by turning off power stage 206 thereby turning off power transfer between coils L1 and L2. The time-varying currents through coils L1 and L2 then cease as indicated at 365. As a result of the cessation of power transfer through isolator 120, capacitor C2 begins to discharge into the load and output voltage VOUT begins to fall. The process repeats.

In one example, controller 138 can generate the TX_ON_PLS signal 233 to provide a status indication between the TURN-ON and TURN-OFF indications 304 and 354. In the example of FIG. 3, the status indication is encoded as a status bit in the TX_ON_PLS signal 233 towards the end of the TURN-ON indication 304. Switching detect circuit 226 detects whether power is being transferred to second circuit 120 from first circuit 110 through isolator 120 and asserts the SEC_SW_DET signal 235 to a first logic state if power is being transferred through isolator 120 or to a second logic state if power is not being transferred through isolator 120. In the example of FIG. 3, switching detect circuit 226 asserts the SEC_SW_DET signal 235 to a logic high state at rising edge 357 upon detection of power transfer through isolator 120. In response to receipt of the SEC_SW_DET signal 235 at the logic high state, controller 138 determines that second circuit 130 is receiving power and, in response, causes the TX_ON_PLS signal 233 to transition from a logic high state to a logic low state at falling edge 349 thereby terminating pulse 304*b*. Otherwise, if controller 138 does not receive a logic high assertion of the SEC_SW_DET signal 235, indicative of the condition that power is not being transferred through isolator 120 to second circuit 130, controller 138 causes the logic high state to logic low state transition of TX_ON_PLS 233 at a later point in time-falling edge 353. Accordingly, whether the TX_ON_PLS signal 233, and the corresponding RX_OUT_PLS signal 237, is either logic low or logic high during time period 359 indicates a status of second circuit 130, e.g., whether second circuit 130 is or is not receiving power transferred through isolator 120.

Decoder 118 determines whether the RX_OUT_PLS signal 237 is logic low or logic high during time period 359. A logic low (e.g., a "0") indicates a status that second circuit 130 is receiving power transferred through isolator 120. A logic high (e.g., a "1") indicates a status that second circuit 130 is not receiving power from isolator 120. Decoder 118 generates the FAULT_STATE signal 245 to indicate the corresponding 1 or 0. In this example, the FAULT_STATE signal 245 is a single bit signal. In response to receipt of the FAULT_STATE signal 245 indicating that the second circuit 130 is not receiving power through isolator 120, control and fault management 208 may respond by, for example, discontinuing future activations of power stage 206.

Figure 4:
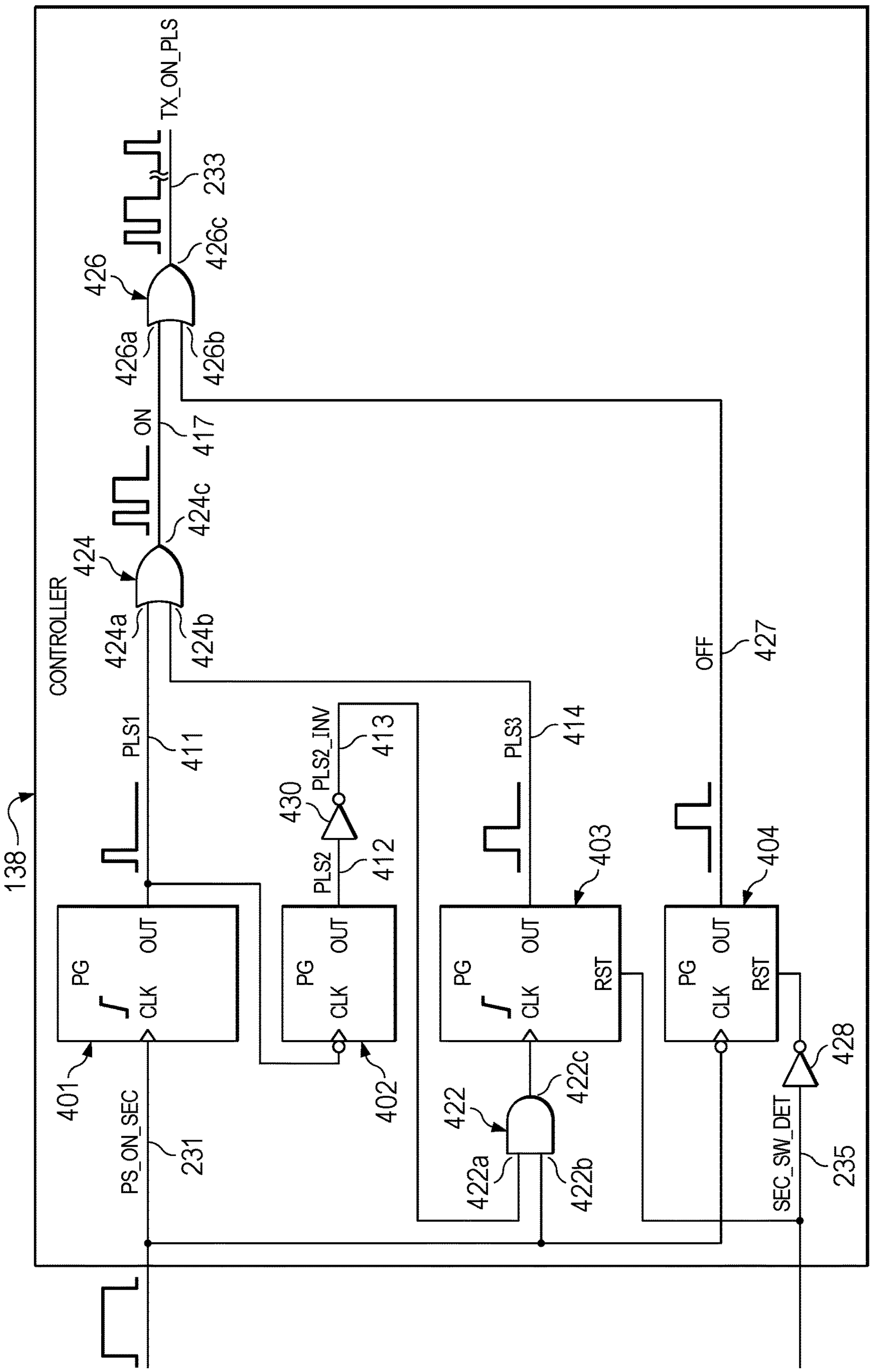
FIG. 4 is a circuit diagram of a controller usable in the isolated power converter of FIG. 2, in an example.

FIG. 4 is a schematic diagram of controller 138, in an example. In this example, controller 138 includes pulse generators (PGs) 401, 402, 403, and 404, OR gates 424 and 426, and inverters 428 and 430. Each PG 401-404 has a clock input terminal (CLK). PGs 401 and 403 are clocked with a rising edge on their clock input terminals, and PGs 402 and 404 are clocked with a falling edge on their clock input terminals. The clock input terminals of PGs 401 and 404 receive the PS_ON_SEC signal 231. The output OUT terminal of PG 401 is coupled to an input terminal 424*a* of OR gate 424 and the clock input terminal of PG 402. PG 401 produces a PLS1 signal 411 at its OUT terminal. The OUT terminal of PG 402 is coupled to an input of inverter 430. PG 401 produces a PLS2 signal 412 at its OUT terminal. The output of inverter 430 is coupled to an input terminal 422*a* of AND gate 422 and produces a PLS2_INV signal 413, which is the logical inverse of the PLS2 signal 412. Input terminal 422*b* of AND gate 422 receives the PS_ON_SEC signal 231.

The OUT terminal of PG 403 is coupled to an input terminal 424*b* of OR gate 424. The output terminal 426*c* of OR gate 424 is coupled to an input terminal 426*a* of OR gate 426 and produces an ON signal 417. The OUT terminal of PG 404 is coupled to an input terminal 426*b* of OR gate 426 and produces an OFF signal 427. OR gate 426 produces the signal TX_ON_PLS 233 at its output terminal 426*c*.

When clocked, each PG 401-404 produces a pulse of a particular pulse width for its respective output signal. In one example, PG 401 produces the PLS1 signal 411 to have a pulse of width 25 ns. PG 402 produces the PLS2 signal 412 to have a pulse of width 30 ns. PG 403 produces the PLS3 signal 414 to have a pulse of width 1 μs. PG 404 produces the OFF signal 427 to have a pulse of width 1 μs. Different values of the pulse widths are possible in other examples.

PGs 403 and 404 have a reset (RST) terminal. The SEC_SW_DET signal 235 is provided to the RST terminal of PG 403 and, through inverter 428 to the RST terminal of PG 404. A logic high state of a signal at the RST terminal of PG 403 and PG 404 causes the respective PG to force the signal at the PG's OUT terminal to a logic low state. For example, when the SEC_SW_DET signal 235 is logic high, PG 403 resets and forces the PLS3 signal 414 to a logic low state. Similarly, when the SEC_SW_DET signal 235 is logic low, due to inverter 428, PG 404 resets and forces the OFF signal 427 to a logic low state. When clocked, PGs 403 and 404 produce pulses having pulse widths of, for example, 1 μs, unless reset before the end of the 1 μs time period.

Figure 5:
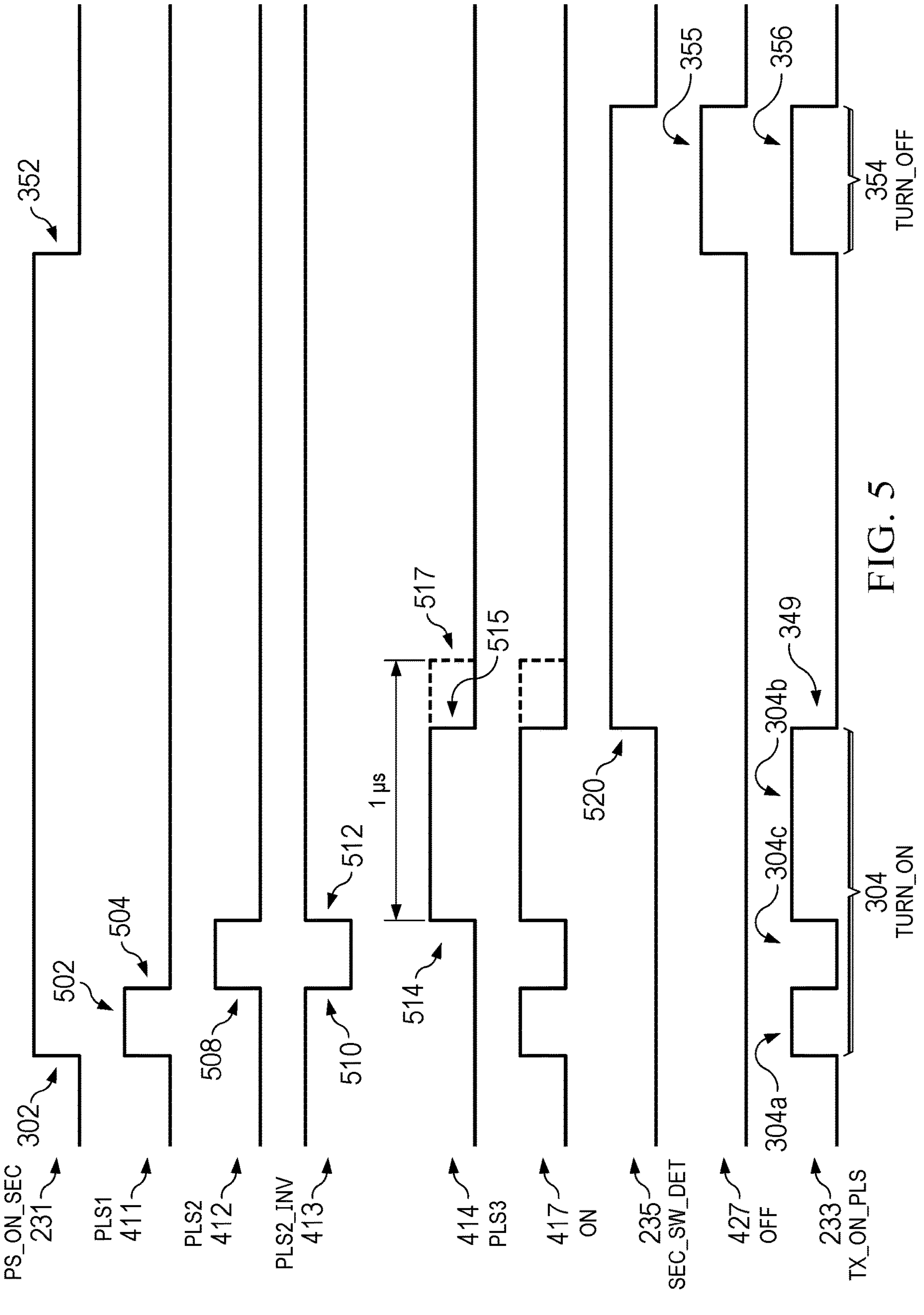
FIG. 5 is a timing diagram illustrating the operation of the controller of FIG. 4, in an example.

FIG. 5 is a timing diagram illustrating the operation of controller 138. The timing diagram includes the PS_ON-_SEC signal 231, the PLS1 signal 411, the PLS2 signal 412, the PLS2_INV signal 413, the PLS3 signal 414, the ON signal 417, the SEC_SW_DET signal 235, the OFF signal 427, and the TX_ON_PLS signal 233.

Referring to both FIGS. 4 and 5, the rising edge 302 of the PS_ON_SEC signal 231 causes PG 401 to produce a pulse 502 for the PLS1 signal 411 with a pulse width of, for example, 25 ns. Through OR gates 424 and 426, pulse 502 results in pulse 304a for the TX_ON_PLS signal 233. The falling edge 504 of pulse 502 clocks PG 402 thereby causing PG 402 to produce a pulse 508 for the PLS2 signal 412 with a pulse width of, for example, 30 ns. The PLS2_INV signal 413 is generated by inverter 430 is the logical inverse of the PLS2 signal 412 and, accordingly, produces a negative pulse 510. With the PS_ON_SEC signal 231 still being at the logic high state, the rising edge 512 of the negative pulse 510 clocks, through AND gate 422, PG 403. PG 403 responds by producing a pulse 514 for the PLS3 signal 414 having a pulse width of, for example, 1 μs, unless PG 403 is reset before the expiration of the 1 μs time period. In the example of FIG. 5, the SEC_SW_DET signal 235 transitions from a logic low state to a logic high state at rising edge 520, thereby resetting PG 403 and terminating pulse 514 at falling edge 515 before the end of the full 1 μs time period. Otherwise, absent the logic high state of the SEC_SW_DET signal 235, pulse 514 would have been longer (e.g., 1 μs from PG 403) and have terminated at falling edge 517. Through OR gates 424 and 426, pulse 514 results in pulse 304b for the TX_ON_PLS signal 233. The combination of the shorter pulse 304a and the longer pulse 304b represents the TURN-ON indication 304, described above.

The falling edge 352 of the PS_ON_SEC signal 231 clocks PG 404, which responds by producing a pulse 355 for the OFF signal 427. Through OR gate 426, pulse 355 results in the TX_ON_PLS signal 233 having pulse 356. Pulse 356 represents the TURN-OFF indication 354 described above.

Figure 6:
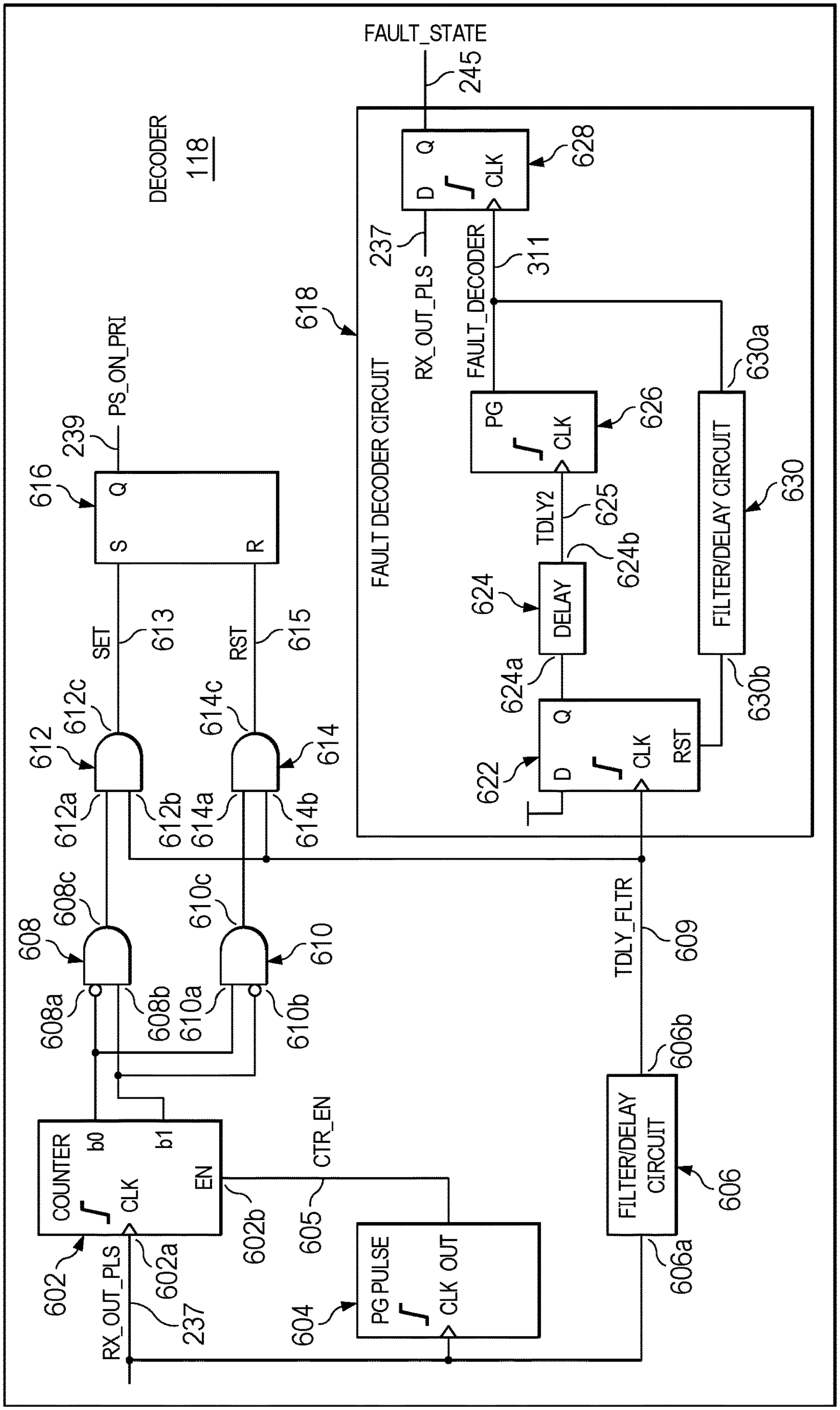
FIG. 6 is a circuit diagram of a decoder usable in the isolated power converter of FIG. 2, in an example.

FIG. 6 is a schematic diagram of decoder 118, in an example. In this example, decoder 118 includes a counter 602, a PG 604, a filter/delay circuit 606, AND gates 608, 610, 612, and 614, a set(S) reset (R) flip-flop 616, and a fault decoder circuit 618. Fault decoder circuit 618 includes data (D) flip-flops 622 and 628, a delay circuit 624, a PG 626, and a filter/delay circuit 630.

Counter 602 has a clock terminal 602a, an enable (EN) terminal 602b, an output b0 terminal, and an output b1 terminal. The RX_OUT_PLS signal 237 is provided to the clock terminal 602a. PG 604 has a clock input that receives the RX_OUT_PLS signal 237. The OUT terminal of PG 604 is coupled to the enable terminal 602b of counter 602. PG 604 generates a signal CTR_EN 605 at its OUT terminal. The output b0 terminal of counter 602 is coupled to an input terminal 608a (e.g., an inverted input) of AND gate 608 and to an input terminal 610a of AND gate 610. The output b1 terminal is coupled to an input terminal 608b of AND gate 608 and to an input terminal 610b (e.g., an inverted input) of AND gate 610. The output terminal 608c of AND gate 608 is coupled to an input terminal 612a of AND gate 612. The output terminal 610c of AND gate 610 is coupled to an input terminal 614a of AND gate 614.

Filter/delay circuit 606 has an input terminal 606a and an output terminal 606b. The RX_OUT_PLS signal 237 is provided to the input terminal 606a. Filter/delay circuit 606 generates a TDLY_FLTR signal 609 at its output terminal 606b. The output terminal 606b of filter/delay circuit 606 is coupled to input terminals 612b and 614b of AND gates 612 and 614, respectively, and to a clock terminal of D flip-flop 622. SR flip-flop has an S terminal, an R terminal, and a Q terminal. The output terminal 612c of AND gate 612 is coupled to the S terminal, and the output terminal 614c of AND gate 614 is coupled to the R terminal. AND gate 612 generates a set (SET) signal 613 at its output terminal 612c. AND gate 614 generates a reset (RST) signal 615 at its output terminal 614c. SR flip-flop 616 generates the PS_ON_PRI signal 239 at its Q terminal.

The D terminal of D flip-flop 622 is coupled to a logic high voltage terminal. The Q terminal of D flip-flop 622 is coupled to an input terminal 624a of delay circuit 624. An output terminal 624b of delay circuit 624 is coupled to a clock terminal of PG 626. Delay circuit 624 generates a TDLY2 signal 625 at its output terminal 624b. In response to a rising edge of the TDLY2 signal 625, PG 626 produces a pulse having a width of, for example, 250 ns at its output terminal. The output terminal of PG 626 is coupled to a clock input of D flip-flop 628 and to an input terminal 630a of filter/delay circuit 630. PG 626 generates a FAULT_DECODER signal 311 at its output terminal. The RX_OUT_PLS signal 237 is provided to the D input of D flip-flop 628. D flip-flop 628 generates the FAULT_STATE signal 245 at its Q output based on the logic state of the RX_OUT_PLS signal 237 upon each rising edge of the FAULT_DECODER signal 311. An output terminal 630b of filter/delay circuit 630 is coupled to the RST terminal of D flip-flop 622. The delay implemented by filter/delay circuit 630 allows time for D flip-flop 628 to be clocked before D flip-flop 622 is reset.

The example counter 602 is two-bit counter which advances its output count value with each rising edge at its clock terminal 602a. The least significant bit is b0 and the most significant bit is bit b1. Upon initially being enabled by a logic high state at the enable terminal 602b, bits <b1: b0> initially have the values 00. With each successive rising edge at clock terminal 602a, bits <b1: b0> sequence through the output count values 01, 10, and 11.

PG 604 generates a pulse on the CTR_EN signal 605 having a pulse width of, for example, 150 ns. The width of the pulse of CTR_EN signal 605 is longer than the width of the first pulse 338a of TURN-ON indication 304 and the time period 339 between the end of the first pulse 338a and the rising edge of the subsequent pulse 338b. The width of the pulse of CTR_EN is long enough to allow counter 602 to count both the edges of both pulses 338a and 338b of the TURN-ON indication 304. In the example in which the width of pulse 338a is 25 ns and the width of time period 339 is 30 ns, the width of pulse the pulse of CTR_EN is at least 55 ns. In one example, the width of the pulse of CTR_EN is 150 ns.

Filter/delay circuit 606 produces the TDLY_FLTR signal 609 to be a delayed version of its input signal, RX_OUT_PLS, if a pulse of the RX_OUT_PLS signal 237 has a width of at least m ns. In one example, m is 50 ns. If the width of a pulse of the RX_OUT_PLS signal 237 is less than m ns (e.g., less than 50 ns), the filter/delay circuit 606 does not generate a delayed pulse on the TDLY_FLTR signal 609. If the width of a pulse of the RX_OUT_PLS signal 237 is at least m ns (e.g., at least 50 ns), the filter/delay circuit 606 generates a pulse on the TDLY_FLTR signal 609 with the same width as its input signal (RX_OUT_PLS signal 237) but delayed by m ns. Filter/delay circuit 630 in fault decoder circuit 618 is similar. It too produces a delayed signal to the RST terminal of D flip-flop 622 based on a pulse of the FAULT_DECODER signal 311 that is at least m ns (e.g., 50 ns) wide. Delay circuit 624 produces TDLY signal 625 as a delayed version (e.g., 750 ns) of the signal from the Q terminal of the D flip-flop 622. Each of filter/delay circuits 606 and 630 may include an RC filter coupled to a buffer.

Figure 7:
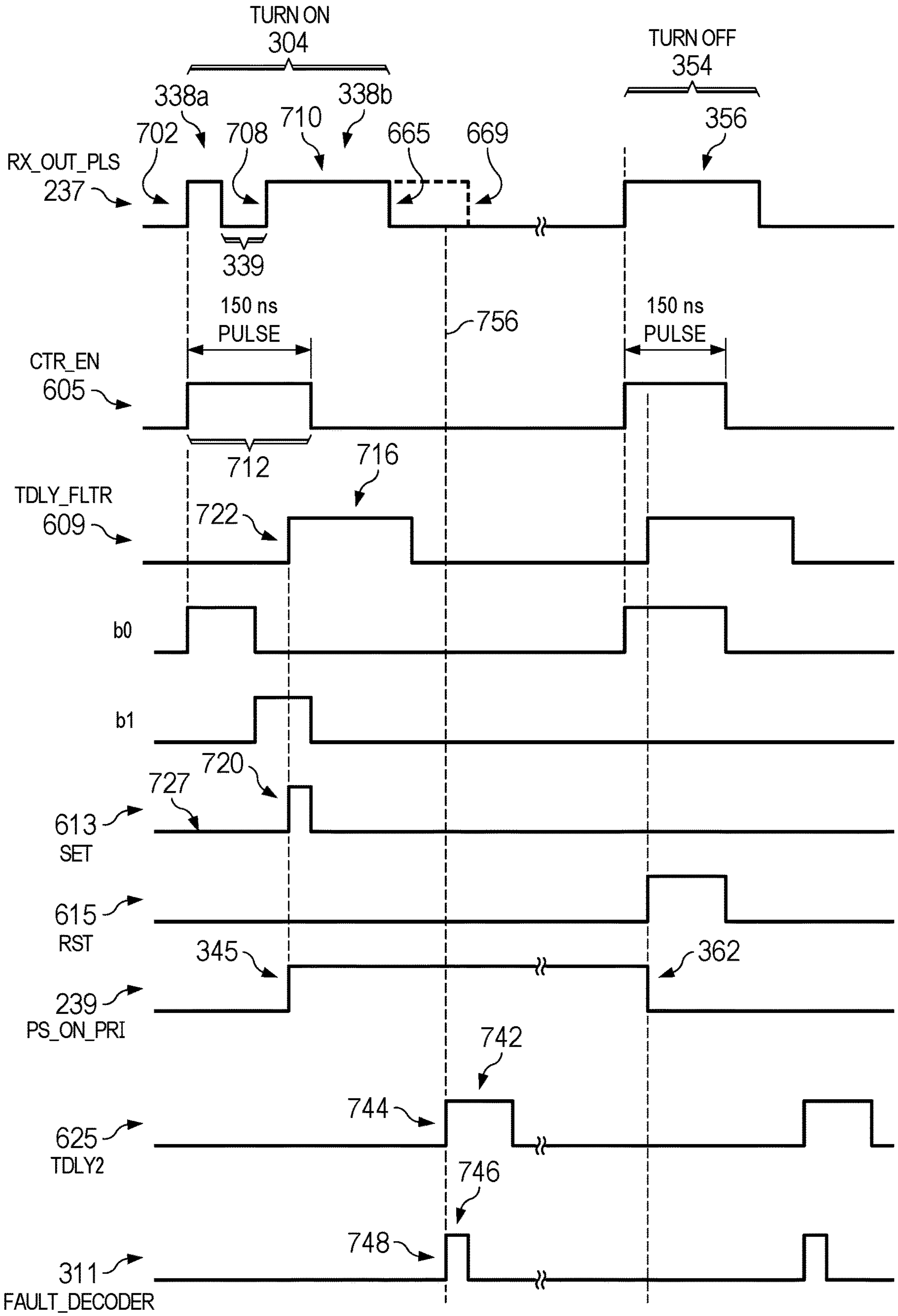
FIG. 7 is a timing diagram illustrating the operation of the decoder of FIG. 6, in an example.

FIG. 7 is a timing diagram illustrating the operation of decoder 118, in an example. The timing diagram includes the RX_OUT_PLS signal 237, the CTR_EN signal 605, the TDLY_FLTR signal 609, b0 (the signal at the output b0 of counter 602), b1 (the signal at the output b1 of counter 602), the SET signal 613, the RST signal 615, the PS_ON_PRI signal 239, the TDLY2 signal 625, and the FAULT_DECODER signal 311.

Referring to FIGS. 6 and 7, rising edge 702 of the first pulse 338*a* of the TURN-ON indication 304 causes counter 602 to advance its output count value thereby causing <b1:b0> to be advanced from 00 to 01. With b0 equal to logic 1 and b1 equal to logic 0, the logic state of the signal at the input 612*a* of AND gate 612 is logic 1. The width of pulse 338*a* is not long enough for filter/delay circuit 606 to generate a delayed output pulse and thus the input 612*b* of AND gate 612 remains a logic 0. Accordingly, the SET signal 613 is logic 0, as indicated at 727.

The next rising edge 708 of the second pulse 338*b* of the RX_OUT_PLS signal 237 causes counter 602 to again increment its output count value from 01 to 10. With b1 equal to logic 1 and b0 equal to logic 0, the output signal from AND gate 608 begins logic 1. The width of the second pulse 338*b* of the TURN-ON transition 304 is long enough to cause filter/delay circuit 606 to generate a pulse 716 for the TDLY_FLTR signal 609. With both the TDLY_FLTR signal 609 and the output signal of AND gate 608 being logic high, the SET signal 613 becomes logic high at rising edge 720. With the S terminal of SR flip-flop 619 being logic high, SR flip-flop 616 causes the PS_ON_PRI signal to transition to a logic high state at rising edge 345, thereby causing control and fault management 208 to cause power stage 206 to turn on power transfer through isolator 120.

The rising edge 722 of the TDLY_FLTR signal 609 causes D flip-flop 622 to clock the logic 1 at its D input terminal through to its Q output terminal. Delay circuit 624 delays the rising edge at the signal at its input terminal 624*a* by, for example, 750 ns, to produce a pulse 742 for the TDLY2 signal 625. PG 626 responds to the rising edge 744 of pulse 742 at its clock terminal by generating a pulse 312 (e.g., 25 ns wide) for FAULT_DECODER signal 311 into the clock terminal of D flip-flop 628. When clocked, D flip-flop 628 generates the FAULT_STATE signal 245 to have the same logic state as the logic state of the RX_OUT_PLS signal 237 when the rising edge 748 of pulse 312 occurs. In the example of FIG. 7, when rising edge 748 occurs, the logic state of the RX_OUT_PLS signal 237 is logic low as a result of falling edge 665 which corresponds to falling edge 349 of the TX_ON_PLS signal 233 in FIG. 3. Accordingly, in this example, the logic state of the FAULT_STATE signal 245 is a logic 0, which indicates, as described above, that power is being transferred from first circuit 110 to second circuit 130 through isolator 120.

If switching detect circuit 226 had not detected the occurrence of power transfer through isolator 120 into second circuit 120, then switching detect circuit 226 would not have asserted the SEC_SW_DET signal 235 to a logic high state and PG 403 (FIG. 4) would not have been reset. If PG 403 is not reset by a logic high state for the SEC_SW_DET signal 235, then the second pulse 304*b* of the TURN-ON transition 304 in FIG. 3 will not have a falling edge until falling edge 669 at the end of the full time period of the pulse generated by PG 403 (e.g., a pulse of 1 μs). In that case, the logic state of the FAULT_STATE signal 245 will be a logic 1 because the RX_OUT_PLS signal 237 will still be at a logic high state when D flip-flop is clocked by the rising edge 748 of the FAULT_DECODER signal 311.

Figure 8:
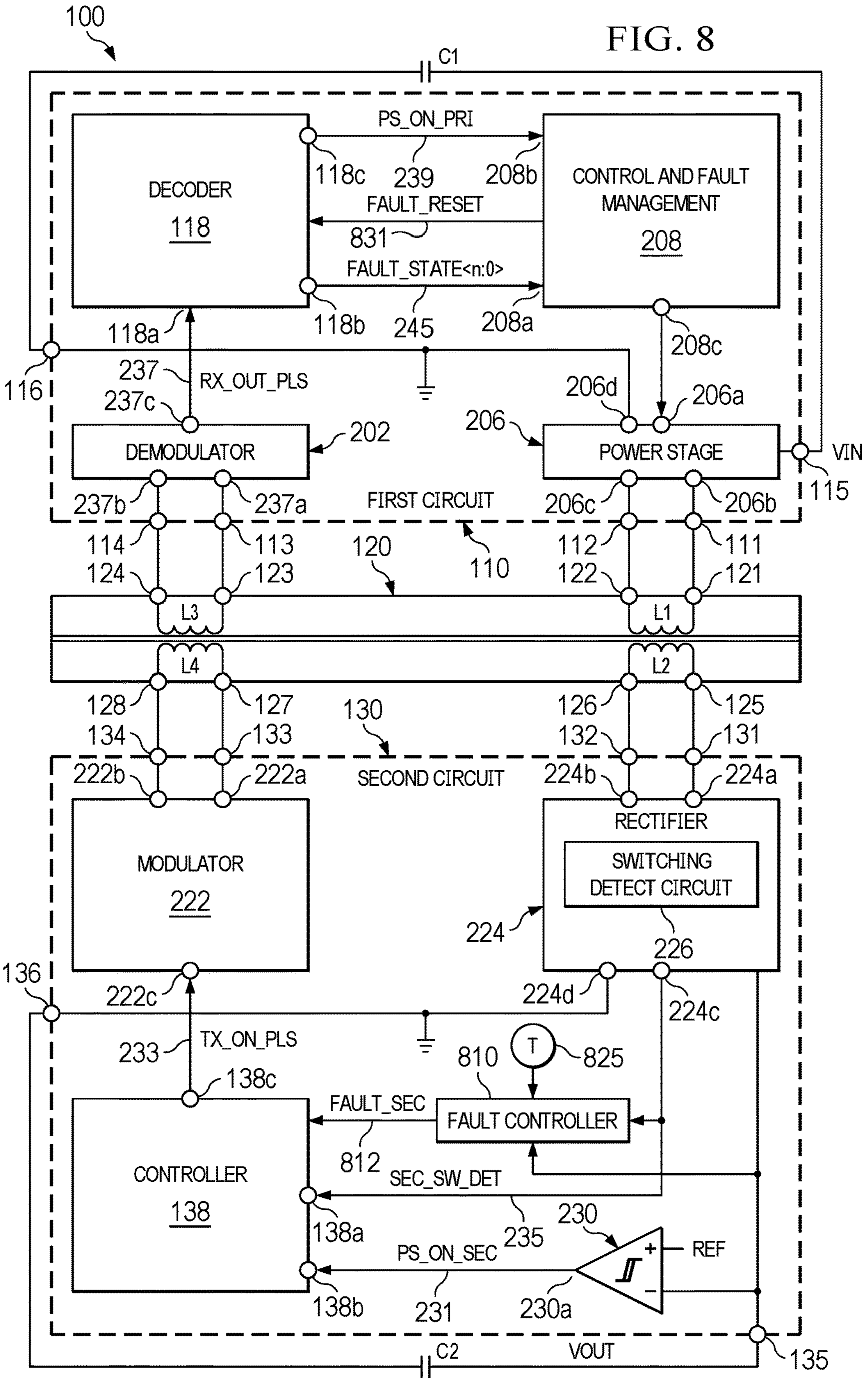
FIG. 8 is a block diagram of the isolated power converter in another example in which a multi-bit fault indication can be communicated through an isolation barrier.

FIG. 8 is a block diagram of isolated power converter 100 in another example capable of generating a multi-bit fault indication and transmitting the multi-bit fault indication from second circuit 130 to first circuit 110. The isolated power converter 100 of FIG. 8 is largely the same as that of the isolated power converter of FIG. 2, and its description is not repeated here. The isolated power converter 100 of FIG. 8 also includes a fault controller 810 that provides an output FAULT_SEC signal 812 to controller 138. In the example of FIG. 8, a temperature sensor 825 is included and coupled to fault controller 810. The output voltage VOUT is also provided to fault controller 810. Fault controller 810 generates a multi-bit fault indication to represent any of multiple fault conditions. Examples of such fault conditions include (a) whether second circuit 130 is receiving power from first circuit 110 (as described above), (b) an over-temperature fault, (c) whether output voltage VOUT is too low (under-voltage fault), etc. In one example, fault controller 810 receives input signals representing fault states and generates the multi-bit fault indication. The multi-bit fault indication may include any number of bits, e.g., three bits. A 3-bit fault indication can represent eight different fault conditions. Fault controller 810 controls the logic state of the FAULT_SEC signal 812 to cause controller 138 to generate each bit of the multi-bit fault indication. Controller 138 encodes each bit of the multi-bit fault indication in the logic state at the end of pulse 304*b*, as described above. Controller 138 generates multiple sets of the TURN_ON indication 304 and the TURN_OFF indication 354 to transmit the multi-bit fault indication. Each TURN_ON indication 304 includes a fault bit of the multi-bit fault indication.

Fault controller 810 prepends the multi-bit fault indication with, e.g., a logic "1" as a flag to indicate to control and fault management 208 that the subsequent, e.g., three bits represent the fault indication. The flag bit and the bits of the multi-bit fault indication are transmitted serially through coils L4 and L3 of isolator 120 from the modulator 222 to the demodulator 202 as part of each subsequent TURN_ON indication 304. Control and fault management 208 detects the presence of the flag bit and then receives the subsequent bits forming the multi-bit fault indication, FAULT_STATE<n:0> 245. Control and fault management 208 may respond to the fault indication in any suitable manner, e.g., by turning off power stage 206. Upon receiving the full multi-bit fault indication FAULT_STATE<n:0> 245, control and fault management 208 generates a FAULT_RESET signal 831 to decoder 118.

Figure 9:
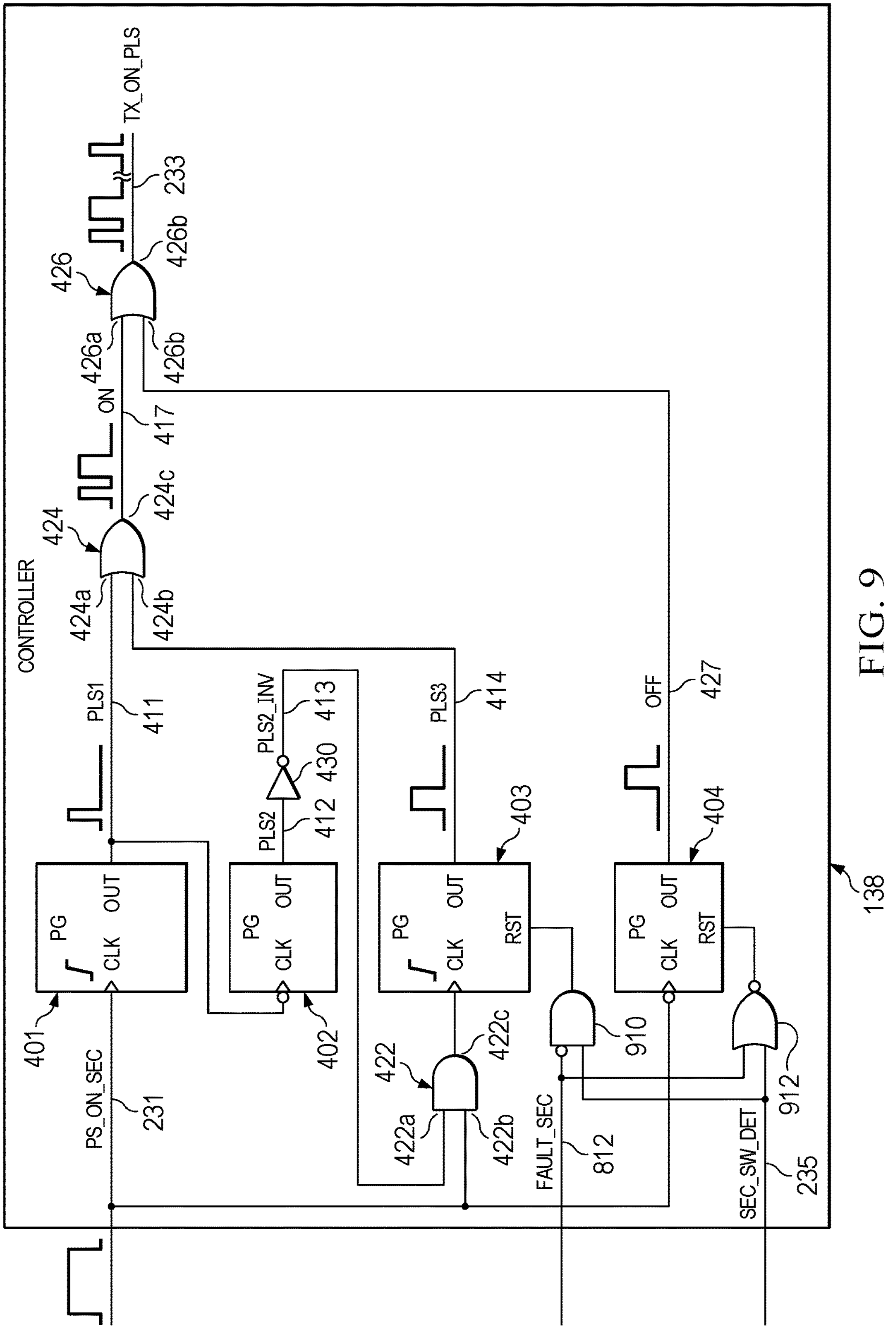
FIG. 9 is a circuit diagram of a controller usable in the isolated power converter of FIG. 8, in an example.

FIG. 9 is a circuit schematic of controller 138 suitable for use in generating a multi-bit fault indication. Controller 138 in FIG. 9 is largely the same as controller 138 in FIG. 4 and its full description is not repeated here. Controller 138 in FIG. 9 also includes an AND gate 910 and a NOR gate 912. One input of each of AND gate 910 and NOR gate 912 receives the SEC_SW_DET signal 235. The FAULT_SEC signal 812 is provided to an inverted input of AND gate 910 and to the other input of NOR gate 912. The output of AND gate 910 is coupled to the reset terminal of PG 403. The output of NOR gate 912 is coupled to the reset terminal of PG 404.

PG 403 is reset thereby forcing the PLS3 signal 414 to a logic low if the FAULT_SEC signal 812 is logic low and the SEC_SW_DET signal 235 is logic high. Otherwise, PG 403 will force the PLS3 signal 414 logic low at the end of its time period (e.g., 1 μs). If either of the SEC_SW_DET signal 235 or the FAULT_SEC signal 812 are logic high, NOR gate 912 generates a logic 0 for its output signal to the reset terminal of PG 404.

Figure 10:
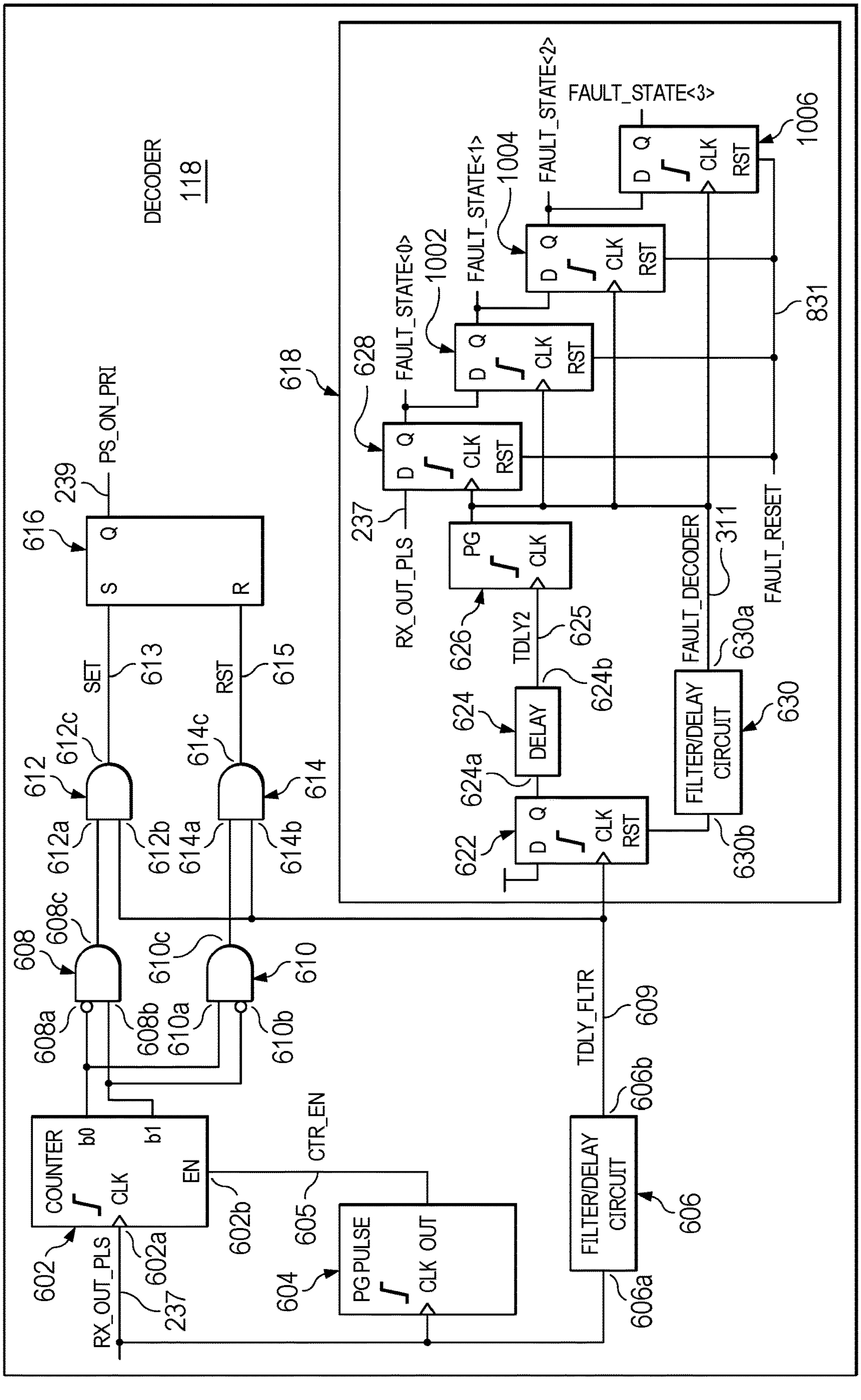
FIG. 10 a circuit diagram of a decoder usable in the isolated power converter of FIG. 8, in an example

FIG. 10 is a circuit schematic of decoder 118 suitable for use in decoding a multi-bit fault indication. Decoder 118 in FIG. 10 is largely the same as decoder 118 in FIG. 6 and its full description is not repeated here. Decoder 10 in FIG. 10 also includes additional D flip-flops 1002, 1004, and 1006. The combination of D flip-flops 628, 1002, 1004, and 1006 form a shift-register to shift in each bit of the multi-bit fault indication. The output signal from D flip-flops 628, 1002, 1004, and 1006 are bits 0, 1, 2, and 3, respectively, of the multi-bit fault indication (assuming a 3-bit fault indication). Upon receipt of all of the bits of the multi-bit fault indication, control and fault management 208 asserts (e.g., logic high) the FAULT_RESET signal 831 to reset D flip-flops 628, 1002, 1004, and 1006 to prepare them to receive the next multi-bit fault indication.

Figure 11:
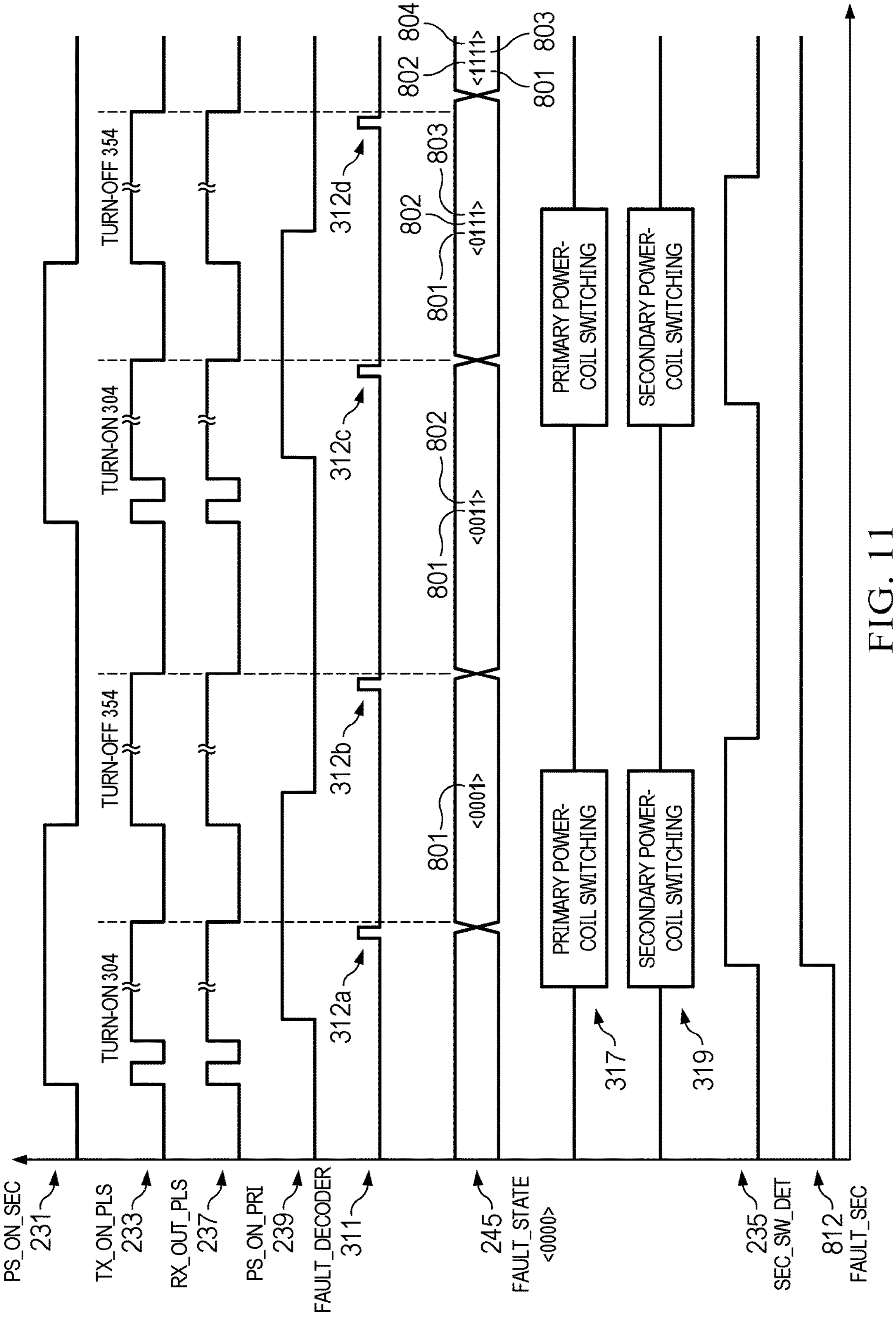
FIG. 11 is a timing diagram illustrating the generation of a multi-bit fault indication, in an example.

FIG. 11 is a timing diagram in another example in which a multi-bit fault indication can be transmitted through isolator 120 and decoded by decoder 118. Each bit of the multi-bit fault indication is recovered by decoder 118 in a separate cycle of the TURN-ON and TURN-OFF indications. The example timing diagram of FIG. 11 includes the same signals as in the timing diagram of FIG. 3. Each instance of a pulse 312, shown as pulses 312*a*-312*d* in FIG. 8, of the FAULT_DECODER signal 311 causes D flip-flop 628 to latch the logic state of the RX_OUT_PLS signal 237 as the next bit of the multi-bit fault indication. Each bit latched by D flip-flop 628 is sequenced through the other D flip-flops 1002, 1004, and 1106 upon each pulse of the FAULT_DECODER signal 311. In the example of FIG. 11, the FAULT_STATE signal 245 has a 4-bit value with each of the four consecutive pulses 312*a*-312*d* causing one of the four bits of the 4-bit value to be recovered. The first bit (e.g., most significant bit) may be the flag bit described above indicating the beginning of a multi-bit fault indication. The first pulse 312*a* results in bit 801 of the FAULT_STATE signal 245 (e.g., the flag bit). The second pulse 312*b* results in bit 802 of the FAULT_STATE signal 245. The third and fourth pulses 312*c* and 312*d* result in bits 803 and 804, respectively, of the FAULT_STATE signal 245. I Bits 802, 803, and 804 represent the fault (e.g., power not being transferred through isolator 120, over-temperature, under-voltage, etc., or combinations thereof. In the example of FIG. 11, each of the bits is a logic "1" because fault controller 810 has held the FAULT_SEC signal 812 logic high thereby preventing PG 403 from being reset and allowing the PLS3 signal 414 to be extended to the end of the time period of PG 403. If fault controller 810 had forced the FAULT_SEC signal 812 logic low for any of the bits, then the logic state of the SEC_SW_DET signal 235 would have dictated the logic state of the corresponding fault bit.

Figure 12:
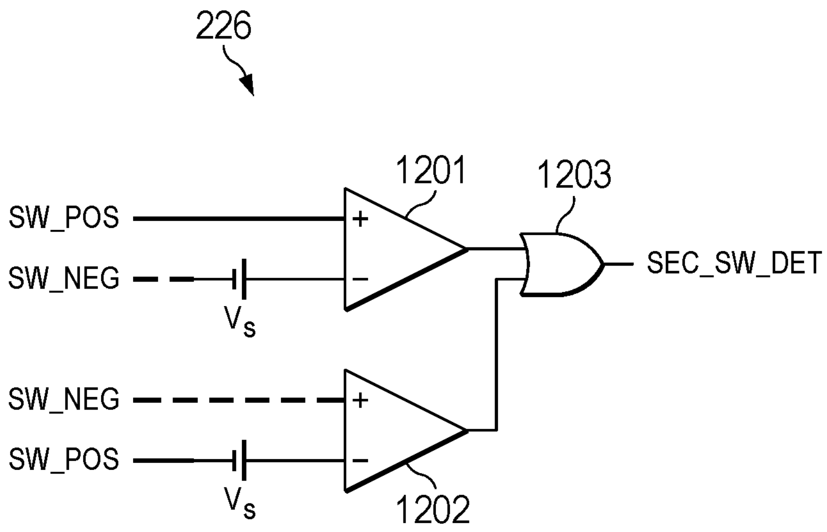
FIG. 12 is a circuit schematic of a switching detect circuit usable in the isolated power converters described herein, in an example.
Figure 13:
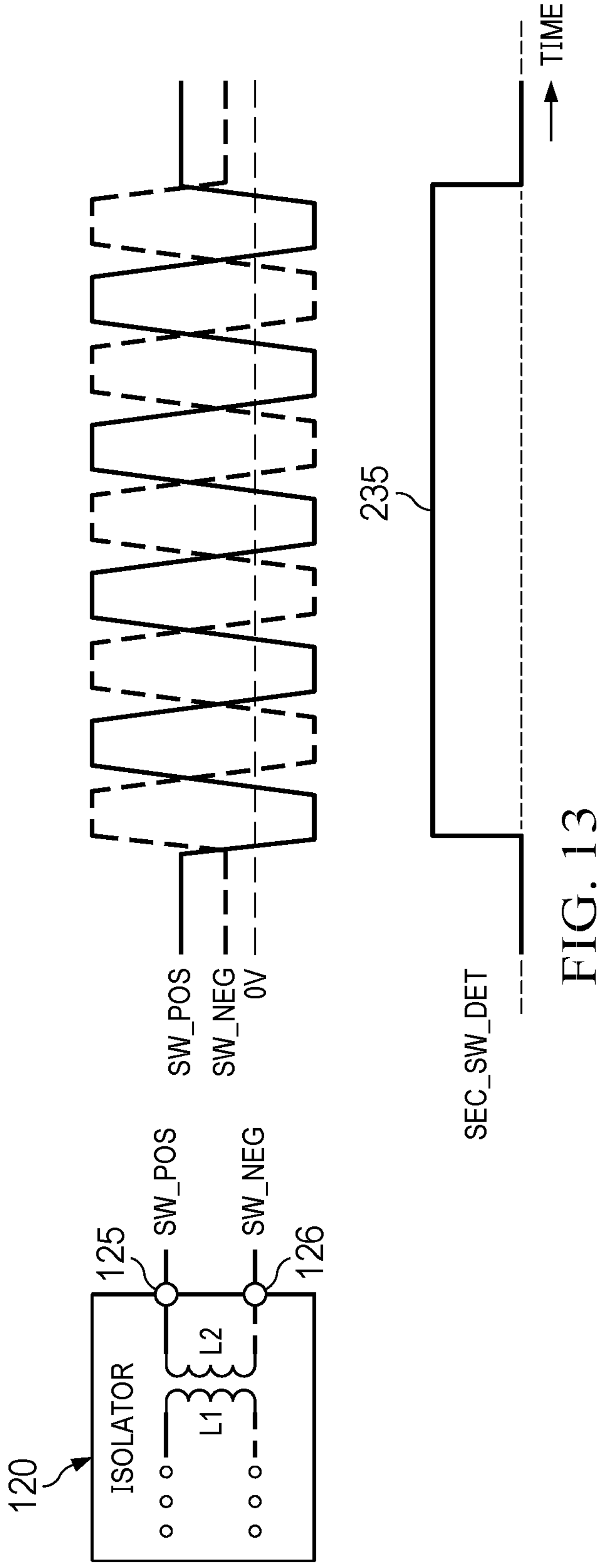
FIG. 13 is a timing diagram illustrating the operation of the switching detect circuit of FIG. 12, in an example.

FIG. 12 is a schematic diagram of switching detect circuit 226, in an example. FIG. 13 is a timing diagram illustrating the operation of switching detect circuit 226. In this example, switching detect circuit 226 includes comparators 1201 and 1202 and an OR Gate 1203. The positive input of comparator 1201 and the negative input of comparator 1202 are coupled to terminals 125 and 126, respectively, of isolator 120. The negative input of comparator 1201 and the positive input of comparator 1202 are coupled to terminals 126 and 125, respectively, of isolator 120. The voltage on terminal 125 is SW_POS and the voltage on terminal 126 is SW_NEG. Each comparator 1201 and 1202 compares SW_POS to SW_NEG. Voltage $V_B$ represents a fixed offset voltage so that each comparator outputs a logic high signal if the signal at the positive terminal is larger than the SW_NEG or SW_POS signal provided to the negative terminal by at least the voltage $V_B$. Comparator 1201 outputs a logic high if SW_POS is larger than SW_NEG by voltage $V_B$. Comparator 1202 outputs a logic high if SW_NEG is larger than SW_POS by voltage $V_b$.

FIG. 13 illustrates switching across coil L2 when power is being transferred through isolator 120. OR gate logically ORs the output signals from comparators 1201 and 1202. During each cycle of the switching waveform of FIG. 13, one or the other of comparators 1201 and 1202 outputs a logic high signal and thus the output signal from OR gate 1203, SEC_SW_DET 235, is logic high during power transfer through isolator 120.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. An apparatus, comprising:

a first circuit having a first terminal coupled to a first isolation terminal, and having a second terminal coupled to a second isolation terminal; and a second circuit having a first terminal coupled to a third isolation terminal, and having a second terminal coupled to a fourth isolation terminal, the second circuit including a controller configurable to transmit, through the first through fourth isolation terminal to the first circuit, a first indication to turn on a power transmission from the first circuit to the second circuit, a second indication of a status, and a third indication to turn off the power transmission.

2. The apparatus of claim 1, wherein:

the first indication includes a first signal pulse followed by a second signal pulse, the second signal pulse having a different pulse length from the first signal pulse.

3. The apparatus of claim 2, wherein the third indication includes a single pulse.

4. The apparatus of claim 2, wherein the status is indicated in a length of the second signal pulse.

5. The power converter of claim 2, wherein the controller is configurable to determine that the second circuit receives power and, in response, provide the second indication by terminating the second signal pulse.

6. The apparatus of claim 1, wherein the status indicates whether the second circuit receives the power transmission.

7. The apparatus of claim 1, wherein:

the second indication includes a status bit; and the controller is configurable to transmit multiple sets of the first indication, the second indication, the third indication, the status bit of each of the multiple sets being part of a multi-bit fault indication.

8. The apparatus of claim 7, wherein the multi-bit fault indication indicates at least one of: whether the second circuit receives power, an over-temperature fault, or an undervoltage fault.

9. The apparatus of claim 1, wherein the controller includes:

a first pulse generator having an output;

a second pulse generator having an input coupled to the output of the first pulse generator, and having an output; and a third pulse generator having an input coupled to the output of the second pulse generator.

10. The apparatus of claim 9, wherein the third pulse generator is configurable to generate a longer pulse than the second pulse generator, and the second pulse generator is configurable to generate a longer pulse than the first pulse generator.

11. The apparatus of claim 1, wherein the first and second circuits are part of a power converter.

12. The apparatus of claim 1, further comprising an isolator coupled between the first circuit and the second circuit, the first and second circuits and the isolator being part of a packaged integrated circuit.

13. The apparatus of claim 12, wherein the first circuit has fifth and sixth isolation terminals and the second circuit has seventh and eighth isolation terminals, the first circuit configurable to provide the power transmission to the second circuit via the fifth through eighth isolation terminals.

14. The apparatus of claim 12, wherein the isolator includes a first transformer coupled between the first through fourth isolation terminals and a second transformer coupled between the fifth through eighth isolation terminals.

15. An apparatus, comprising:

a first circuit having a first terminal coupled to a first isolation terminal, and having a second terminal coupled to a second isolation terminal; and a second circuit having a first terminal coupled to a third isolation terminal, and having a second terminal coupled to a fourth isolation terminal;

wherein the first circuit includes a decoder configurable to extract, from one or more signals received from the second circuit through the first through fourth isolation terminal, a first indication to turn on a power transmission to the second circuit, a second indication of a status of the second circuit, and a third indication to turn off the power transmission.

16. The apparatus of claim 15, wherein the first indication includes a first signal pulse followed by a second signal pulse, the second signal pulse having a different pulse length from the first signal pulse, and the third indication includes a single pulse.

17. The apparatus of claim 16, wherein the status is indicated in a length of the second signal pulse.

18. The apparatus of claim 15, wherein the status indicates whether the second circuit receives power.

19. The apparatus of claim 15, wherein:

the second indication includes a status bit; and the decoder is configurable to extract a multi-bit fault indication, each bit of the multi-bit fault indication being the status bit of the second indication of each of multiple sets of the first, second, and third indications.

20. The apparatus of claim 19, wherein the multi-bit fault indication indicates at least one of whether the second circuit is receiving power, an over-temperature fault, or an under-voltage fault.

21. The apparatus of claim 19, wherein the decoder includes:

a delay having an input, and having an output; and a flip-flop having a clock input coupled to the output of the delay circuit, and having a data input.

22. An apparatus, comprising:

a first circuit having a first terminal coupled to a first isolation terminal and having a second terminal coupled to a second isolation terminal; and a second circuit having a first terminal coupled to a third isolation terminal and having a second terminal coupled to a fourth isolation terminal, the second circuit configurable to transmit, through the first through fourth isolation terminals to the first circuit, an indication of whether the second circuit receives power from the first circuit.

23. The apparatus of claim 22, wherein the second circuit is configurable to transmit, through the first through fourth isolation terminals to the first circuit, an indication of whether to transmit power to the second circuit.

24. The apparatus of claim 23, wherein the indication of whether to transmit power to the second circuit includes a first signal pulse followed by a second signal pulse, the second signal pulse being different from the first signal phase.

* * * * *